(12) United States Patent
Emmert et al.

(10) Patent No.: US 10,897,108 B2
(45) Date of Patent: Jan. 19, 2021

(54) DEVICE FOR USE IN EXPLOSIVE ATMOSPHERE ZONES

(71) Applicant: BARTEC GmbH, Bad Mergentheim (DE)

(72) Inventors: Wolfgang Emmert, Wertheim (DE); Sebastian Kuhn, Ilmspan (DE); Ralph Lanig, Laudenbach (DE)

(73) Assignee: BARTEC GmbH, Bad Mergentheim (DE)

(*) Notice: Subject to any disclaimer, the term of this patent is extended or adjusted under 35 U.S.C. 154(b) by 100 days.

(21) Appl. No.: 16/165,218

(22) Filed: Oct. 19, 2018

(65) Prior Publication Data

US 2019/0131750 A1      May 2, 2019

(30) Foreign Application Priority Data

Oct. 26, 2017   (DE) .......................... 10 2017 010 107

(51) Int. Cl.
| | |
|---|---|
| *H01R 13/713* | (2006.01) |
| *H01R 13/24* | (2006.01) |
| *H01R 13/502* | (2006.01) |
| *H05K 5/00* | (2006.01) |
| *H02J 7/00* | (2006.01) |
| *H01M 10/42* | (2006.01) |

(Continued)

(52) U.S. Cl.
CPC ............ *H01R 13/713* (2013.01); *H01M 2/34* (2013.01); *H01M 10/425* (2013.01); *H01R 13/2471* (2013.01); *H01R 13/502* (2013.01); *H01R 13/533* (2013.01); *H01R 13/7037* (2013.01); *H02J 7/0031* (2013.01); *H03K 17/102* (2013.01); *H05K 5/0086* (2013.01); *H01M 2200/00* (2013.01)

(58) Field of Classification Search
CPC .... H01R 13/713; H01R 13/24; H01R 13/502; H01R 13/533; H05K 5/00; H02J 7/00; H01M 10/42; H01M 1/34
USPC .......... 307/115, 116, 113, 43, 64, 66, 80, 82
See application file for complete search history.

(56) References Cited

U.S. PATENT DOCUMENTS

| | | | |
|---|---|---|---|
| 9,729,141 B2 * | 8/2017 | Sailer .................... | G06F 13/382 |
| 2008/0079393 A1 * | 4/2008 | Spartano .................. | H02J 1/00 |
| | | | 320/110 |

(Continued)

FOREIGN PATENT DOCUMENTS

| | | |
|---|---|---|
| DE | 197 48 553 | 5/1999 |
| DE | 100 49 346 | 4/2001 |

(Continued)

*Primary Examiner* — Rexford N Barnie
*Assistant Examiner* — Jagdeep S Dhillon
(74) *Attorney, Agent, or Firm* — Gudrun E. Huckett

(57) ABSTRACT

The device for use in an explosive atmosphere zone has a device housing and at least one energy supply part that is provided with at least one battery or at least one rechargeable battery as well as energy-associated supply contacts. The energy-associated supply contacts interact with device-associated supply contacts when the energy supply part is connected to the device. The energy-associated and device-associated supply contacts have connected upstream thereof switches that, prior to separation of the energy supply part from the device, can be controlled by a circuit such that the switches deenergize the energy-associated and the device-associated supply contacts.

20 Claims, 8 Drawing Sheets

(51) Int. Cl.
*H01M 2/34* (2006.01)
*H01R 13/533* (2006.01)
*H03K 17/10* (2006.01)
*H01R 13/703* (2006.01)

(56) References Cited

U.S. PATENT DOCUMENTS

| | | | |
|---|---|---|---|
| 2015/0008764 A1* | 1/2015 | Doetter | G06F 13/382 |
| | | | 307/115 |
| 2015/0092310 A1 | 4/2015 | Sack | |
| 2018/0131177 A1* | 5/2018 | Onishi | H02H 9/008 |

FOREIGN PATENT DOCUMENTS

| | | |
|---|---|---|
| DE | 10 2006 047 039 | 11/2007 |
| GB | 2 005 932 | 4/1979 |
| WO | 00/11758 | 3/2000 |

* cited by examiner

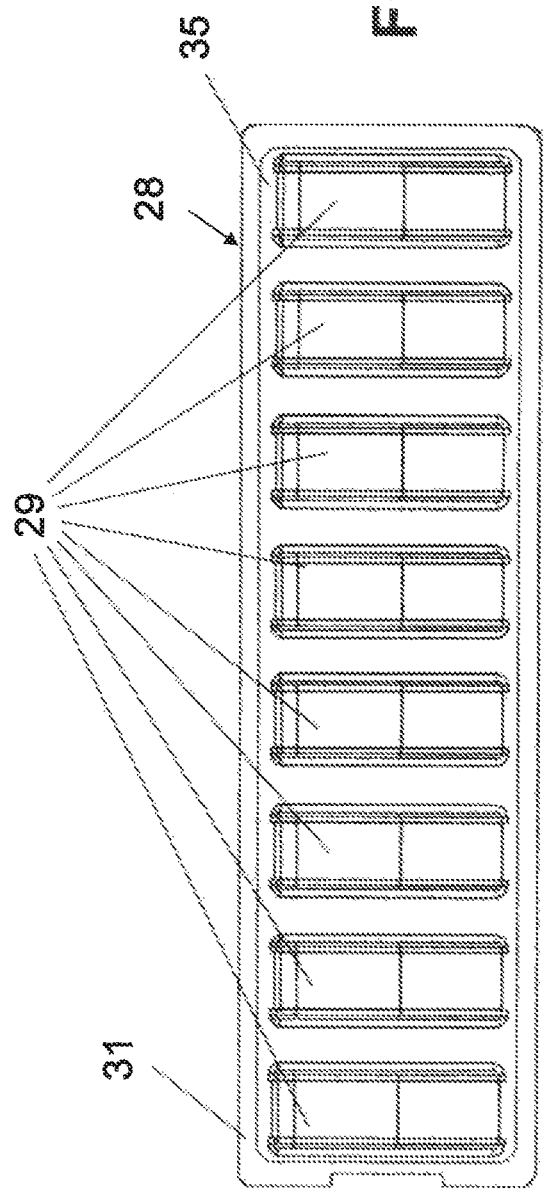
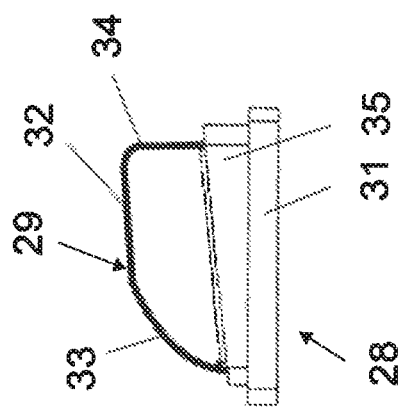
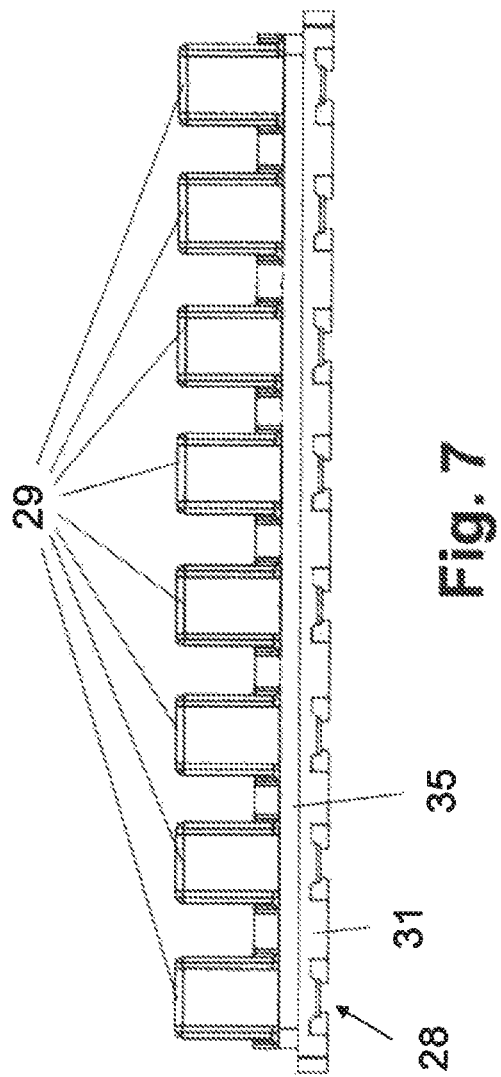

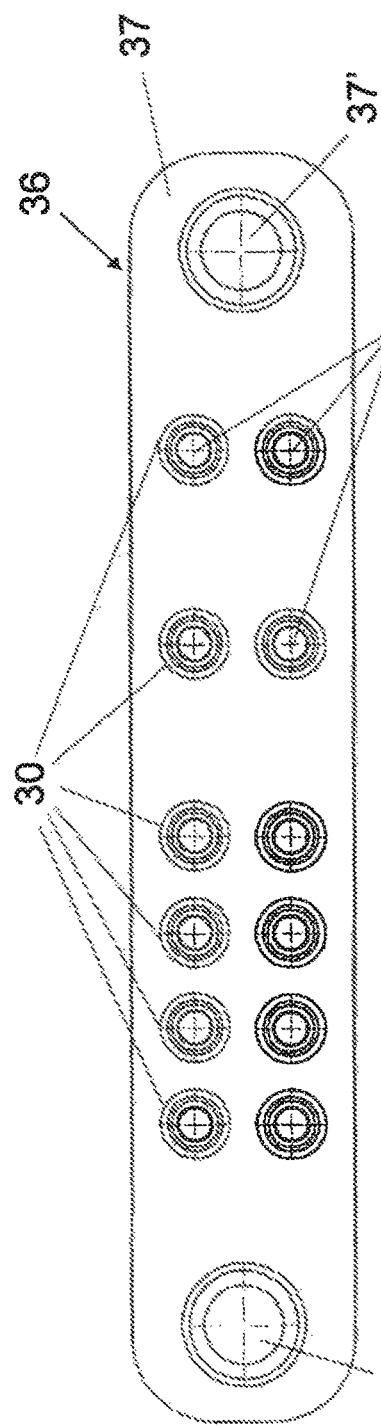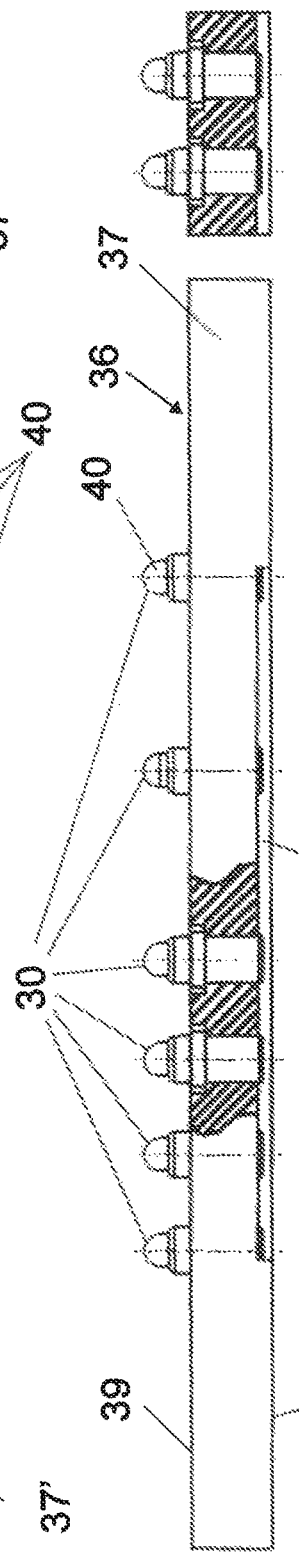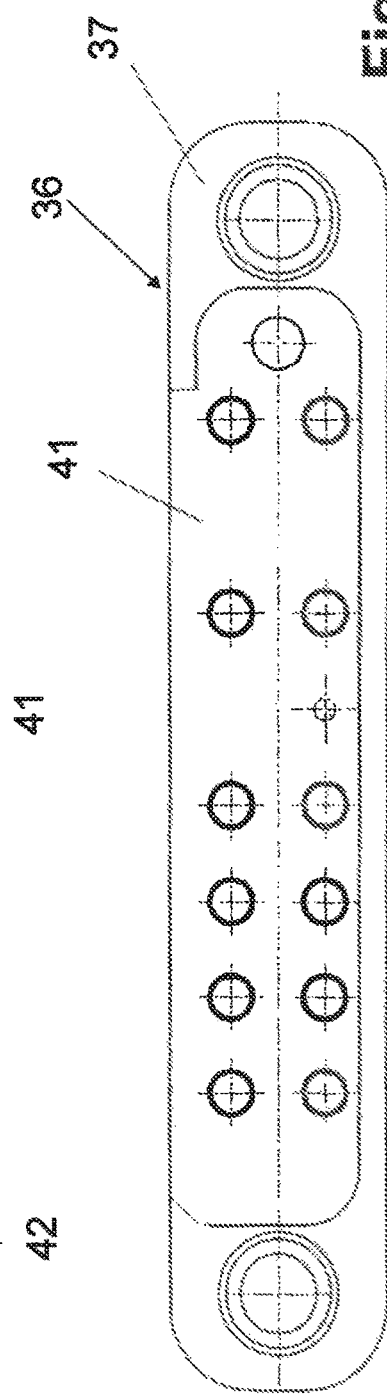

DEVICE FOR USE IN EXPLOSIVE ATMOSPHERE ZONES

BACKGROUND OF THE INVENTION

The invention concerns a device for use in an explosive atmosphere zone. The device has a device housing and at least one energy supply part that comprises at least one battery or at least one rechargeable battery as well as energy-associated supply contacts which interact with device-associated supply contacts when the energy supply part is connected to the device.

In explosive atmosphere zones, electrical devices are used which are furnished with an energy supply part in the form of at least one battery or at least one rechargeable battery. Such devices are, for example, measuring devices, panels, analytical devices, mobile computers, and the like. An exchange of the energy supply part in the explosive atmosphere zone is not possible because in the contact region between the supply contacts with which the device and the energy supply part or energy supply module are electrically connected to each other, an ignition spark may be generated that can trigger an ignition of an explosive atmosphere in the explosive atmosphere zone. For this reason, the devices for the exchange of the energy supply part must be removed from the explosive atmosphere zone in order to perform the exchange of the energy supply part in the safe region.

The invention has the object to configure the device of the aforementioned kind such that an exchange of the energy supply part is possible in the explosive atmosphere zone.

SUMMARY OF THE INVENTION

This object is solved for the device of the aforementioned kind in accordance with the invention in that switches are connected upstream of the supply contacts that, prior to separation of the energy supply part from the device, can be controlled by means of a circuit such that the switches deenergize the supply contacts.

The device according to the invention is characterized in that switches are respectively connected upstream of the supply contacts of the device and of the energy supply part, by means of which, prior to removal of the energy supply part from the device, the supply contacts are switched to a deenergized state. For this purpose, the circuit is provided which controls the switches such that the supply contacts are deenergized. When thus subsequently the supply contacts of device and energy supply part are separated from each other, no ignition spark can be generated as a result of the deenergized state. Therefore, an exchange of the energy supply part can be carried out in the explosive atmosphere zone.

The device according to the invention can be used in all defined explosive atmosphere zones (zones 0, 1, 2, as well as divisions 1, 2).

Advantageously, when connecting the energy supply part to the device, the circuit controls the switches in such a way that the supply contacts can be energized only when they have already been plugged in.

A simple, reliable, and inexpensive solution resides in that transistors, in particular FETs, are used as switches.

The device and the energy supply part each comprise advantageously at least two switches that are controlled independent of each other. Due to this redundancy of the switches, a high reliability is ensured. When the device is used, for example, in the zone 1, then two switches for the device as well as for the energy supply part are sufficient.

When use in the zone 0 is provided, then three independently controllable switches are provided for the device and for the energy supply part.

The circuit is advantageously configured such that it generates control signals for trigger circuits by means of which each individual switch can be controlled independently.

So that the supply contacts by means of which the device and the energy supply part are electrically connected to each other can be switched reliably to a deenergized state, in one advantageous embodiment the circuit comprises device-associated and energy-associated switching elements. The device-associated switching elements actuate the energy-associated switches and the energy-associated switching elements actuate the device-associated switches. Due to this mutual interlacing, it is ensured that the energy supply part can be exchanged in the explosive atmosphere zone without generating an ignition spark. Without the signal triggered at the device side, the supply contact of the energy supply device remains closed. Without the signal triggered by the energy supply part, in turn, the supply contact of the device remains closed.

In an advantageous embodiment, the circuit comprises as switching elements areal contacts and contact elements interacting therewith which are preferably spring contact pins. Upon removal of the energy supply part, first the contact elements disengage from the areal contact so that the supply contacts that are still connected to each other are deenergized.

In order to enable a simple installation of the areal contacts, it is advantageous when the areal contacts are provided on a short-circuit strip. On it, the areal contacts can be positioned in the required position. The short-circuit strip can then be simply installed together with the pre-mounted areal contacts.

Advantageously, the contact elements are arranged on a contact strip. It can also be furnished beforehand with the contact elements and subsequently mounted in a simple way.

As switching elements, the circuit can comprise also permanent magnets and magnet sensors. When the energy supply part is removed from the device, the permanent magnets move away from the magnet sensors so that the switches are controlled such that they deenergize the supply contacts between the energy supply part and the device.

In another embodiment, the circuit can comprise, as switching elements, proximity sensors and inductive or capacitive elements interacting with them. When the energy supply part is removed from the device, the inductive or capacitive elements move out of the detection range of the proximity sensors which then deenergize the supply contacts through the switches.

So that the supply contacts can be reliably deenergized prior to detachment, the housing of the device and/or the housing of the energy supply part is provided with at least one multi-stage slide guide engaged by at least one sliding block. The slide guide ensures that by interacting with the sliding block first the circuit is actuated which deenergize the supply contacts as long as they are still connected to each other.

In an advantageous embodiment, the slide guide is designed such that, upon removal of the energy supply part from the device, the supply contacts are first deenergized by means of the circuit in a first stage.

Only then, the supply contacts of device and energy supply part are detached in a subsequent stage.

The subject matter of the invention results not only from the subject matter of the individual claims but also from all specifications and features disclosed in the drawings and the description. They are, even if they are not subject matter of the claims, claimed as important to the invention, inasmuch as they are, individually or in combination, novel relative to the prior art.

Further features of the invention result from the additional claims, the description, and the drawings.

BRIEF DESCRIPTION OF THE DRAWINGS

The invention will be explained in more detail with the aid of some embodiments illustrated in the drawings.

FIG. 6 shows a plan view of a short-circuit strip of the device according to the invention.

FIG. 7 shows a front view of the short-circuit strip according to FIG. 6.

FIG. 8 shows a side view of the short-circuit strip according to FIG. 6.

FIG. 9 shows a plan view of a contact pin strip of the device according to the invention.

FIG. 10 shows a side view of the contact pin strip according to FIG. 9.

FIG. 11 shows a bottom view of the contact pin strip according to FIG. 9.

DESCRIPTION OF PREFERRED EMBODIMENTS

With the device it is possible to exchange in explosive atmosphere zones the energy supply part without there being the risk of ignition by the exchange or during the exchange. In this way, it is possible to extend the service life of the device almost at will.

Figure 13:
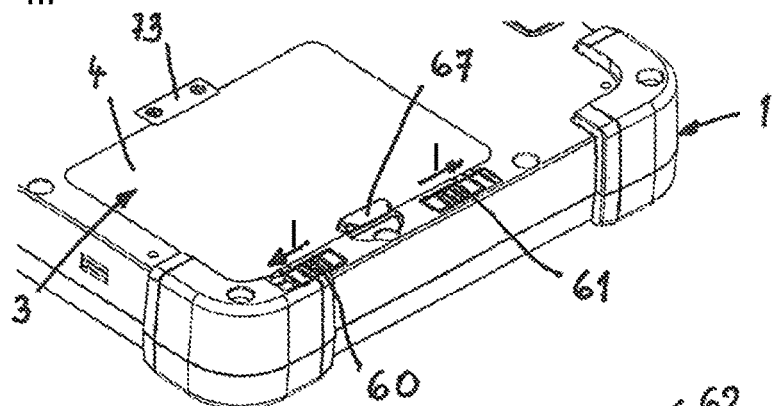
FIG. 13 shows in perspective illustration a first step of the removal process of the energy supply part from the device according to the invention.
Figure 14:
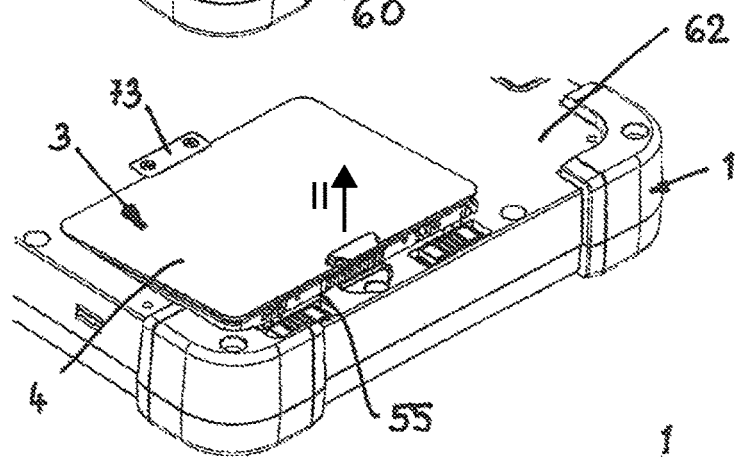
FIG. 14 shows in perspective illustration a second step of the removal process of the energy supply part from the device according to the invention.
Figure 15:
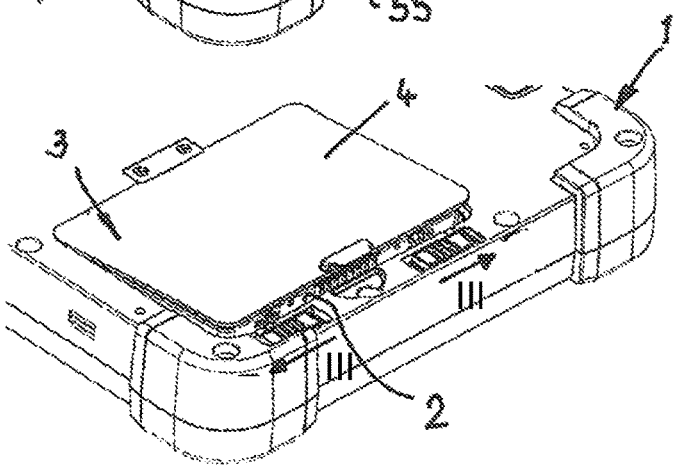
FIG. 15 shows in perspective illustration a third step of the removal process of the energy supply part from the device according to the invention.

In FIGS. 13 to 15, in an exemplary fashion a part of such a device 1 is illustrated that, for example, can be a display device, a measuring device, an analytical device, a mobile computer or the like. It has a receiving compartment 2 for an energy supply part 3 that is provided with a housing 4 in which at least one battery or at least one rechargeable battery is disposed. Usually, the housing 4 contains a battery pack or rechargeable battery pack comprised of several individual cells.

Figure 1:
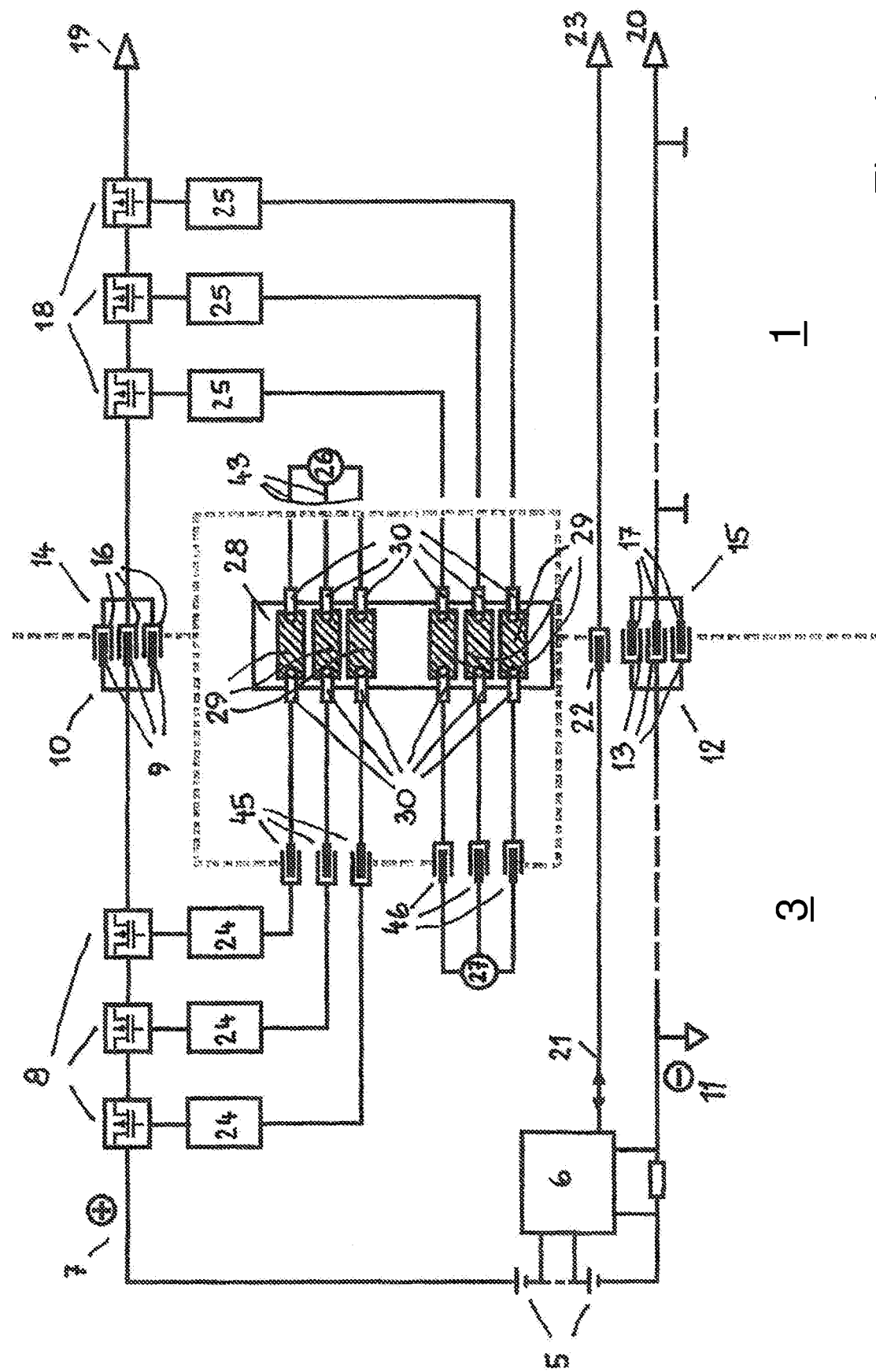
FIG. 1 shows in schematic illustration the circuit configuration of a device according to the invention with an energy supply part.

FIG. 1 shows schematically the circuit configuration of the energy supply part 3 and of the device 1.

The battery/rechargeable battery cells that are parts of the battery/rechargeable battery pack are identified at 5. These packs can comprise one or a plurality of primary cells or one or a plurality of secondary cells 5. In case of rechargeable batteries or battery packs, in the housing 4 a charging/discharging circuit 6 is accommodated. Such circuits are known and are therefore not explained in detail here. Control and monitoring of the rechargeable battery cells 5 are carried out also with this circuit 6. When the housing 4 comprises batteries or battery packs, various control or monitoring elements may also be provided in the housing 4 in that case.

FIG. 1 shows in an exemplary fashion a battery circuit whose positive terminal 7 is separated by at least two, in the embodiment three, serially connected switches 8 from output terminals 9 of a positive output contact 10 which forms a supply contact. The switches 8 are advantageously transistors, in particular FETs. In the illustrated embodiment three switches 8 are provided. The number of these switches 8 depends on the type of explosive atmosphere zone or division in which the device 1 with the energy supply part 3 is to be used. When used in the zone 1, two switches 8 are sufficient while for use in the explosive atmosphere zone 0 three switches 8 are provided. When used in the division 1, three switches are provided. This redundancy of the switches 8 ensures that the functional safety is ensured in case of failure of one of the switches 8.

The negative terminal 11 of the circuit is connected with a negative output contact 12 (supply contact) which is provided with corresponding output terminals 13.

So that the energy supply part 3 can be employed in the explosive atmosphere zones 0, 1, 2 or divisions 1, 2, the two output contacts 10, 12 each have three output terminals 9, 13.

The device 1 is provided with a corresponding positive input contact 14 (supply contact) as well as a corresponding negative input contact 15 (supply contact). Both input contacts 14, 15 comprise a number of positive input terminals 16 as well as negative input terminals 17 corresponding to the number of output terminals 9, 13.

The positive input contact 14 of the device 1 is connected through at least two, in the illustrated embodiment through three, serially connected switches 18 with the positive terminal 19 and the negative input contact 15 with the negative terminal 20.

The switches 18 are advantageously transistors, in particular FETs. The number of the switches 18 depends on the type of explosive atmosphere zone or division in which the device is to be used. The redundancy of the switches 18 ensures that the functional safety of the device in the respective explosive atmosphere zone is ensured in case of failure of one of the switches.

In case the charging/discharging circuit 6 for the rechargeable batteries is used for the supply action or the battery circuit provides control and/or monitoring data, at least one signal line 21 is provided for the communication between the energy supply part 3 and the device 1 which is connected by connector 22 with at least one signal line 23 of the device 1. These signal lines 21, 23 are advantageously bidirectional communication lines.

The switches 8 in the form of transistors are controlled by trigger circuits 24, respectively, which are generally known. The switches 18 in the form of the transistors are also controlled by trigger circuits 25, respectively, as is known in the art. The trigger circuits 24, 25 operate independently from each other and trigger one of the transistors 8, 18, respectively.

The control signal 26 for the trigger circuits 24 is generated in the device 1 and the control signal 27 for the trigger circuits 25 in the energy supply part 3. The electronic connection between the device 1 and the energy supply part 3 relative to the control signals 26, 27 is realized by a short-circuit strip 28 which is comprised of electrically insulating material and may be provided in the device 1 or in the energy supply part 3. Depending on the configuration of the contacts, the short-circuit strip 28 can be installed in different positions, for example, vertically, horizontally, or at a slant.

At the short-circuit strip 28 there are contacts 29 which are advantageously of areal configuration and are comprised of electrically conductive material, for example, of metallic material. The supply of the control signals 26, 27 to the trigger circuits 24, 25 is realized through contact elements 30 which are advantageously configured as spring contact pins. When the energy supply part 3 is inserted into the device 1, the contact elements 30 of the device 1 or of the energy supply part 3 contact the contact elements 29 so that the electrical connection between the device 1 and the energy supply part 3 with respect to the control signals 26, 27 is produced. When the short-circuit strip 28 is installed in the device 1, then the contact elements 30 of the energy supply part 3 contact the contacts 29. On the other hand, the contact elements 30 of the device 1 contact the contacts 29 when the short-circuit strip 28 is accommodated in the energy supply part 3.

As can be seen in FIGS. 6 through 8, the short-circuit strip 28 has a base member 31 which is comprised of electrically insulating material and which has advantageously a rectangular contour. The contacts 29 are attached in a suitable way to the base member 31 of the short-circuit strip 28. For example, the contacts 29 can be glued or inserted or screwed onto the base member 28.

A further possibility resides in that the base member 31 for forming the contacts 29 is coated with a metal by metallization (plating) or galvanically.

The contacts 29 can have any suitable form. In the illustrated embodiment, the areal contacts 29 have a slanted contact side 32 which at one end passes into a curved end member 33 which extends in the direction of the top side of the base member 31. At the other end, the contact side 32 passes approximately at a right angle into a straight end member 34 which is extending to the base member 31.

As shown in FIG. 6, the areal contact 29 extends in an exemplary fashion perpendicular to the longitudinal direction of the short-circuit strip 28.

The contacts 29 are advantageously of the same configuration among each other and are positioned at a spacing, advantageously at the same spacing, adjacent to each other (FIGS. 6 and 7).

The slanted position of the contact side 32 enables a reliable connection of the contact elements 30 with the contacts 29 upon insertion of the energy supply part 3 into the device 1. In order to obtain this advantageous slanted position of the contact side 32 in a simple way, the base member 31 of the short-circuit strip 28 is provided with an attachment 35 which, according to FIG. 6, has for example a rectangular contour but is somewhat smaller than the base member 31. In plan view of the short-circuit strip 28 (FIG. 6), the circumferential rim of the attachment 35 has therefore a minimal spacing from the circumferential rim of the base member 31. The top side of the attachment 35 extends at a slant, as shown in particular in FIG. 8.

The shape of the short-circuit strip 28, shown in FIGS. 6 to 8, is not to be understood as limiting. It can have any other suitable configuration and shape depending on how the energy supply part 3 and/or the device 1 is configured.

The contact elements 30 which are interacting with the contacts 29 are located on a contact strip 36, as illustrated in an exemplary fashion in FIGS. 9 to 11. The contact strip 36 has a base member 37 which is comprised of electrically insulating material, for example, plastic material, and is provided with fastening openings 37'. As an example, it has approximately a rectangular shape and is provided with through openings 38 through which the contact elements 30 project. The latter are advantageously configured as spring contact pins. They project past the topside 39 of the base member 37. The contact elements 30 have spherical contact surfaces 40 so that a reliable contacting with the contacts 29 is ensured. The other end of the contact elements 30 is located within a depression 41 at the bottom side 42 of the base member 37. In this way, the contact elements 30 do not project past the bottom side 42 of the base member 37.

In an exemplary fashion, the contact elements 30 are arranged in two rows at a spacing adjacent to each other and one after another. This is only an exemplary distribution and arrangement of the contact elements 30. The respective position of the contact elements depends on the position of the contacts 29 of the short-circuit strip 28.

The contact elements 30 are fastened in the through openings 38 in a suitable way, for example, glued on or pressed in.

Figure 2:
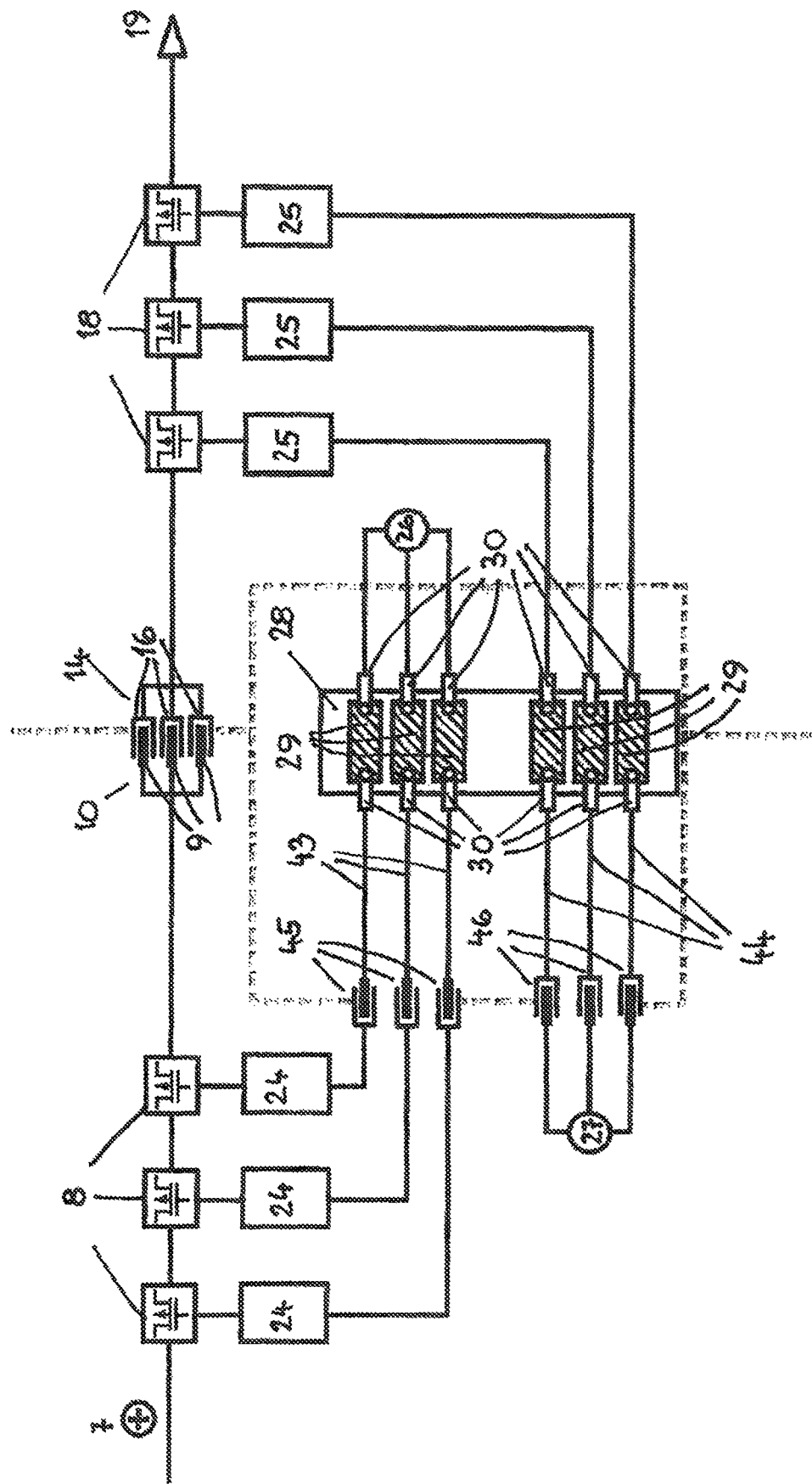
FIG. 2 shows in enlarged illustration a part of the circuit configuration according to FIG. 1.

Control lines 43, 44 (FIGS. 1 and 2) are connected to the ends of the contact elements 30 positioned in the depression 41 and through them the control signals 26, 27 are supplied via the contacts 29 to the trigger circuits 24, 25 (FIGS. 1 and 2).

The control lines 43, 44 are advantageously provided with plug connectors 45, 46 so that upon removal of the energy supply part 3 from the device 1, the signal connection to the trigger circuits 24, 25 is interrupted. The plug connectors 45, 46 are provided in the energy supply part 3.

The switches 8 are activated by the device-associated control signals 26 via the control circuits 24. At the same time, the switches 18 are activated by the control signals 27 of the energy supply part 3 via the control circuits 25. Due to this type of circuitry it is achieved that the output contact 10 remains closed without the control signal 26 of the device 1 and the input contact 14 of the device 1 remains closed without the control signal 27 of the energy supply part 3.

The output terminals 9, 13 and the input terminals 16, 17 are each provided three times and can be embodied relative to the connectors 22, 45, 46 to be leading or following so that, upon installation or removal of the energy supply part 3, they are not simultaneously contacted or separated from each other. Also it is possible to embody the output terminals 9, 13 and the input terminals 16, 17 relative to each other to be leading or following.

The control signals 26, 27 are supplied, independent from each other, to the respective trigger circuits 24, 25. The control lines 43, 44 are insulated relative to each other so that the control signals 26, 27 can be supplied unimpaired to the respective trigger circuit 24, 25. In the embodiment according to FIGS. 1 and 2, the control signals 26, 27 have electrically different potential. The trigger circuits 24, 25 can be built discretely from appropriate electric/electronic components. They can however also be provided as integrated circuits.

The contacts 29 of the short-circuit strip 28 are also insulated from each other so that no connection to other circuit parts of the device 1 and of the energy supply part 3 exists. The supply of control signals 26, 27 to the trigger circuits 24, 25 is realized by means of the contact elements 30 of the contact strip 36. Upon insertion of the energy supply part 3 into the receiving compartment 2 of the device 1, the contact elements 30 reach the proper position at the contacts 29. Since these contacts 29 are insulated from each other and from the other contact locations, the control signals 26, 27 are supplied insulated from other signals to the trigger circuits 24, 25.

By means of the contact elements 30, it is detected whether the energy supply part 3 is arranged in the receiving compartment 2. When the energy supply part 3 is to be removed from the receiving compartment 2, it is ensured by means of a multi-stage guide configuration, to be explained with the aid of FIGS. 12 to 15, that the energy supply part 3 can be removed only once the supply contacts 10, 14; 12, 15 between the energy supply part 3 and the device 1 are deenergized or currentless. In this way, upon removal of the energy supply part 3, no ignition spark can be generated.

The supply of the control signals 26, 27 to the correlated trigger circuits 24, 25 can also be realized by switches or contact spring tongues that are mounted on a strip or directly in/at the housing 4 of the energy supply part 3 or in/at the housing of the device 1.

Figure 3:
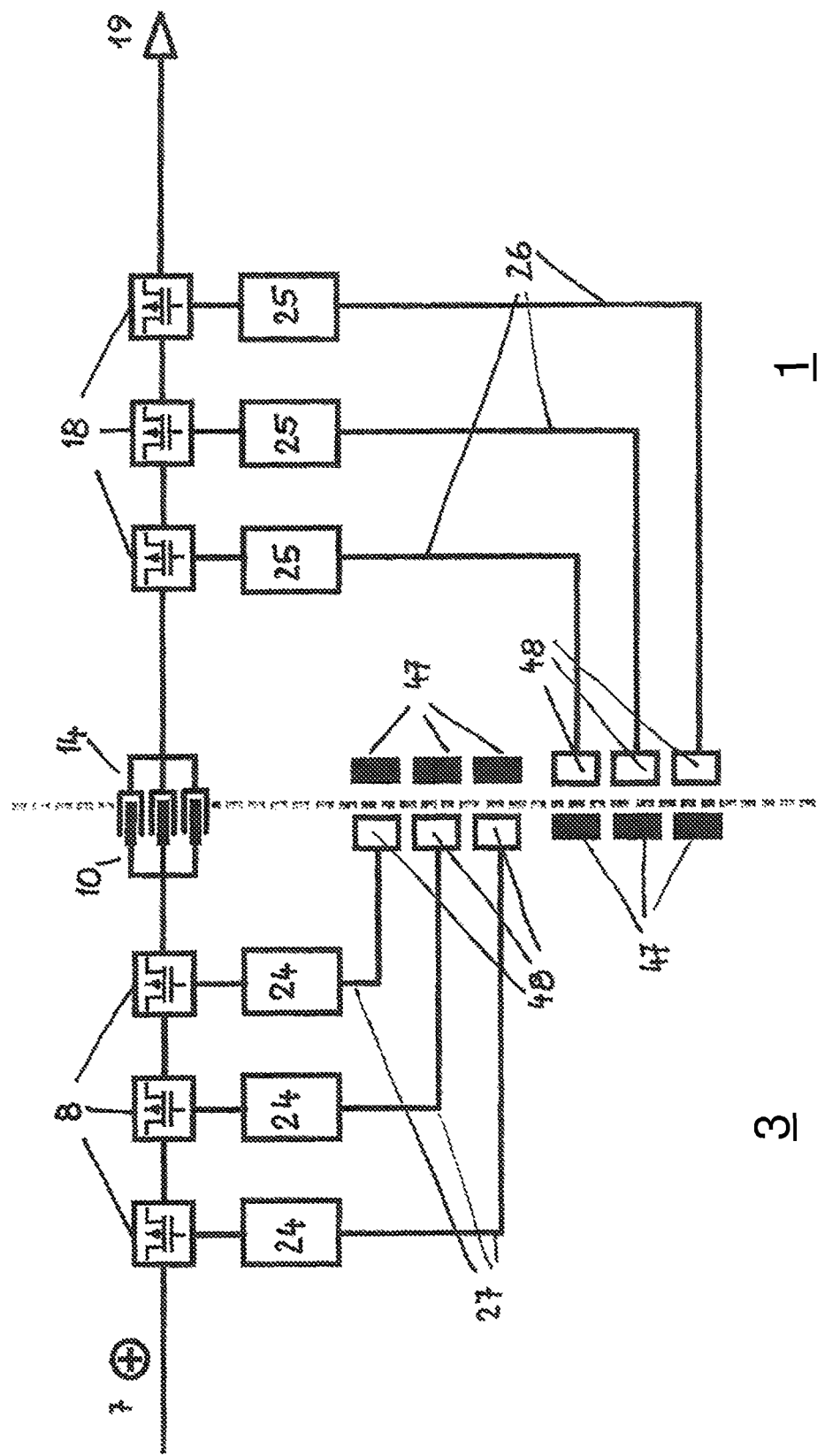
FIG. 3 shows in an illustration corresponding to FIG. 2, a second embodiment of the circuit configuration of the device according to the invention.

In the embodiment according to FIG. 3, magnets 47 and magnet sensors 48 are provided in place of the contacts 29 and the contact elements 30 which are immediately coming into contact with each other. The control signals 26, 27 are produced by magnetic excitation and supplied from the magnet sensors 48 to the trigger circuits 24, 25. In the illustrated embodiment, the device 1 and the energy supply part 3 are provided with three magnets 47 and three magnet sensors 48, respectively. When the energy supply part 3 is inserted into the receiving compartment 2 of the device 1, the magnet sensors 48 detect the respective magnets 47 and generate in this way the control signals 26, 27. As in the preceding embodiment, the switches 8, 18 in the form of the transistors are activated by means of mutual interlacing so that it is ensured again that the supply contacts 10, 14; 12, 15 stay closed when the control signals 26, 27 are not triggered.

The magnets 47 located in the energy supply part 3 are detected by the corresponding magnet sensors 48 in the device 1 which work independent of each other. In the same way, the magnet sensors 48 in the energy supply part 3 which work independent of each other detect the corresponding magnets 47 in the device 1.

The magnets 47, which are permanent magnets, and the magnet sensors 48 interact contactless with each other. In other respects, the circuit of this embodiment is of the same configuration and operates in the same way as in the preceding embodiment.

Figure 4:
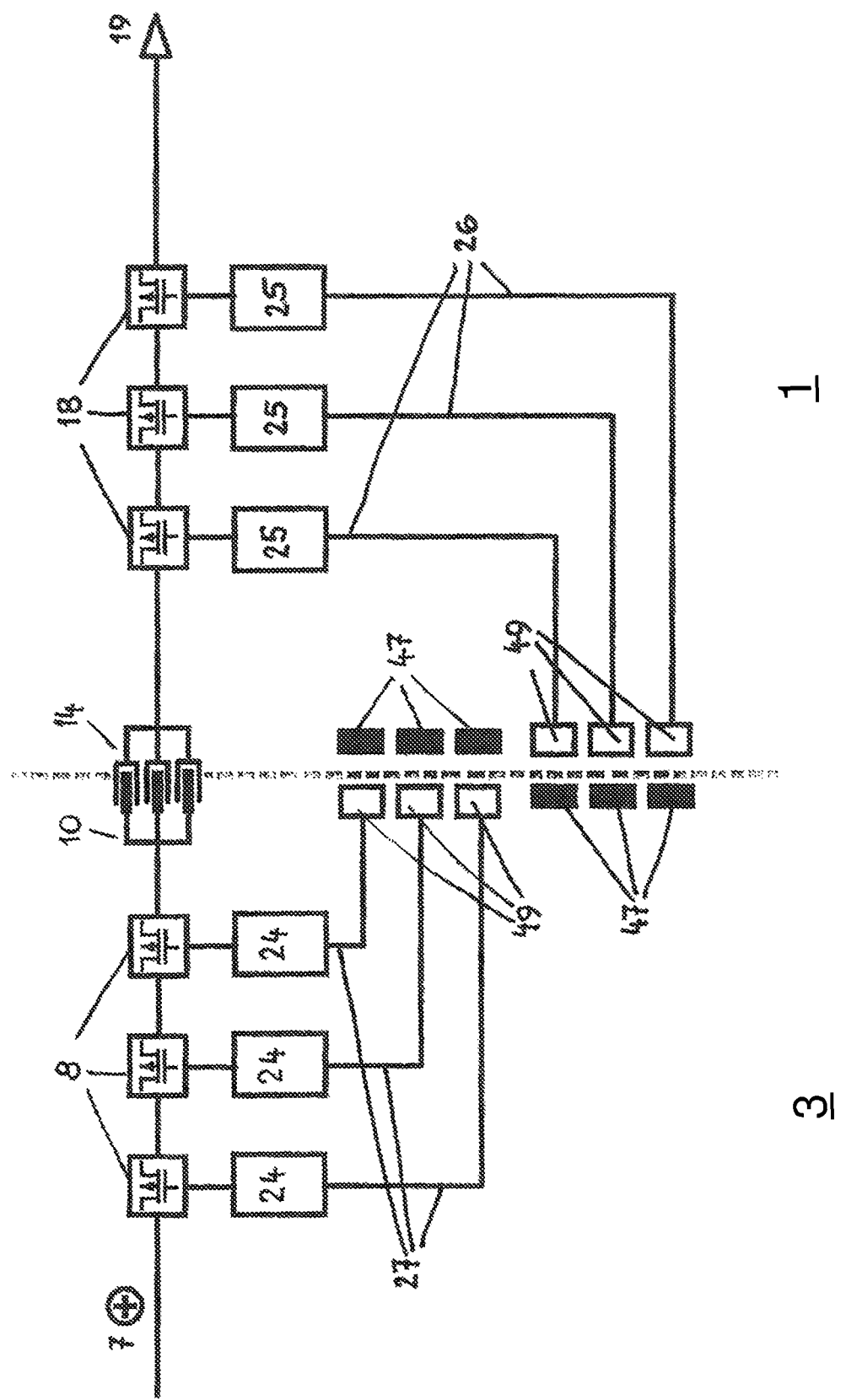
FIG. 4 shows in an illustration according to FIG. 3 the circuit configuration of a further embodiment of a device according to the invention.

In the embodiment according to FIG. 4, the control signals 26, 27 are inductively generated. For this purpose, the magnets 47 and the proximity sensors 49 are provided. As in the preceding embodiment, the device 1 and the energy supply part 3 each comprise three permanent magnets 47 and three proximity sensors 49. The proximity sensors 49 are connected each with one of the trigger circuits 24, 25.

Also, proximity sensors 49 can be employed which are excited upon approach of metals, for example, iron. Then the triggering elements 47 can be metal pieces or metal surfaces. When these metal pieces 47 approach the proximity sensors 49, the control signals 26, 27 are generated.

When the energy supply part 3 is inserted into the receiving compartment 2 of the housing 1, the proximity sensors 49 of the energy supply part 3 approach the permanent magnets 47 of the device 1 and the permanent magnets 47 of the energy supply part 3 approach the proximity sensors 49 of the device 1. One proximity sensor 49 supplies one of the trigger circuits 24, 25 with the respective control signal 26, 27, respectively. As in the preceding embodiments, the proximity sensors 49 work independent of each other.

Figure 5:
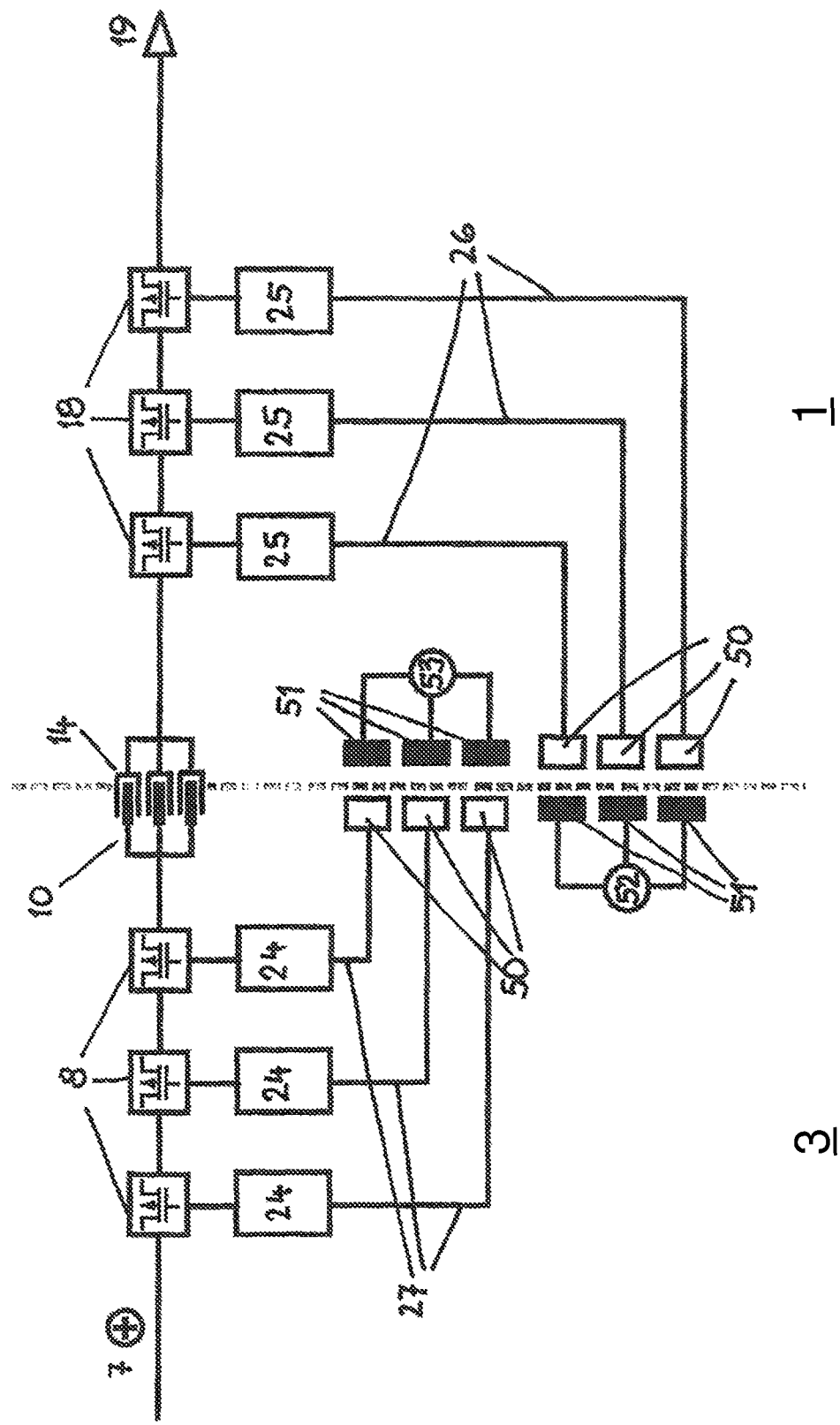
FIG. 5 shows in an illustration corresponding to FIG. 3 the circuit configuration of a further embodiment of a device according to the invention.

FIG. 5 shows an embodiment in which the control signals 26, 27 are generated capacitively. The device 1 and the energy supply part 3 have each the proximity sensors 50 that generate the control signals 26, 27 and supply them to the trigger circuits 24, 25 independent of each other.

The device 1 and the energy supply part 3 are also provided with surfaces 51 causing capacitive excitation which upon inserted energy supply part 3 are oppositely positioned to the respective proximity sensors 50. When these surfaces 51 approach the proximity sensors 50, the control signals 26, 27 are generated. The potential 52 of the capacitively exciting surfaces 51 provided in the energy supply part 3 is produced in the energy supply part 3. The potential 53 of the capacitively exciting surfaces 51 in the device 1 is generated in the device 1.

In other respects, the embodiment according to FIG. 5 is of the same configuration as the embodiment of FIGS. 1 and 2.

Figure 12:
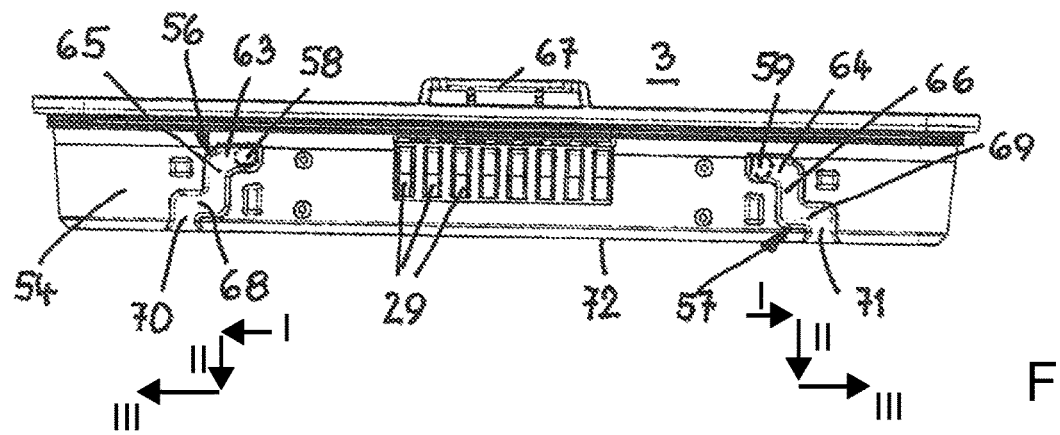
FIG. 12 shows the contact side of the energy supply part of the device according to the invention.

FIG. 12 shows the energy supply part 3 in a side view. At the back wall 54 of the energy supply part 3, the areal contacts 29 are provided which are arranged in a row adjacent to each other. When the energy supply part 3 is inserted in the receiving compartment 2 of the device 1, the contacts 29 engage the device-associated contact elements 30 which are provided at the contact strip 36. The contact elements 30 project past the side wall 55 of the compartment 2 facing the back wall 54 of the energy supply part 3.

The contacts 29 are located in an exemplary fashion at half the width of the back wall 54 (FIG. 12). On either side of the contacts 29, slide guides 56, 57 are provided in the back wall 54 and advantageously are formed as recesses in the back wall 54. The two slide guides 56, 57 in the embodiment are arranged mirror symmetrical to each other in order to generate opposite directions of the opening movement.

The slide guides 56, 57 are engaged by a pin 58, 59, respectively, which is provided at slides 60, 61 (FIG. 13). As can be seen in FIGS. 13 to 15, the slides 60, 61 are arranged at one side 62 of the device 1 adjacent to the receiving compartment 2. The slides 60, 61 are recessed in the side 62. The pins 58, 59 project from the slides 60, 61 inwardly such that they project into the slide guide 56, 57 of the energy supply part 3.

When the energy supply part 3 is inserted in the compartment 2, the pins 58, 59 are positioned at a top horizontal section 63, 64 of the two slide guides 56, 57. In this position, the slides 60, 61 are pushed toward each other in such a way that they have the smallest spacing relative to each other.

When the energy supply part 3 is to be removed from the receiving compartment 2, the two slides 60, 61 are moved in opposite directions relative each other in direction of arrow I (FIGS. 12 and 13). In this way, the pins 58, 59 provided at the slides 60, 61 reach a vertical section 65, 66 of the slide guides 56, 57. In this way, the slides 60, 61 can no longer be moved farther in opposite direction away from each other. The energy supply part 3 is then lifted by means of the grip 67 in the direction of arrow II (FIG. 14). In this way, the slide guides 56, 57 are displaced relative to the pins 58, 59 in the vertical sections 65, 65 until the pins 58, 59 reach a lower horizontal section 68, 69 of the slide guides. Now the energy supply part 3 cannot be lifted farther (FIG. 14).

In this lifted position of the energy supply part 3, the two slides 60, 61 can be displaced opposite to each other in the direction of arrow III (FIGS. 12 and 15) whereby the pins 58, 59 are moved into the horizontal section 68, 69 of the slide guides 56, 57.

The lower horizontal sections 68, 69 then pass into vertical downwardly extending end sections 70, 71 which are open toward the bottom side 72 of the energy supply part 3. In this way, it is possible to remove the energy supply part 3 completely from the receiving compartment 2.

During the removal process, the energy supply part 3 is engaged across at the opposite side by a flap 73. It ensures that the energy supply part 3 can be removed only by the described pivot movement from the receiving compartment 2.

The described multi-stage guide configuration ensures that the energy supply part 3 can be removed only after a multi-stage unlocking process from the receiving compartment 2. In this way, it is achieved that first the circuit 29, 30; 47, 48; 47, 49; 50, 51 generating the control signals 26, 27 deenergizes the supply contacts 10, 14; 12, 15. This is achieved in the embodiment according to FIGS. 1 and 2 in that the contact elements 30 in the form of spring contact pins are disengaged from the contacts 29. In the embodiments according to FIGS. 3 to 5, the magnets 47 or the capacitively exciting surfaces 51 are removed from the proximity sensors 49, 50. Only upon complete removal of the energy supply part 3, the supply contacts 10, 14; 12, 15 are then separated from each other. Since they are now deenergized, no ignition spark can be produced upon removal of the energy supply part 3.

The described multi-stage guide configuration is to be understood only as an example. For removal of the energy supply part 3, it must only be ensured that the supply contacts 10, 14; 12, 15 first become deenergized before the supply contacts are detached from each other.

The energy supply part 3 must not be insertable into a receiving compartment 2 in the described manner. It is conceivable also to insert the energy supply part 3 into a slot compartment. In this case, the energy supply part 3 is inserted by sliding into the device 1. In this case, it can also be ensured that upon pulling out the energy supply part 3 first the supply contacts 10, 14; 12, 15 are deenergized before the energy supply part 3 can be pulled out completely. For this purpose, a multi-stage guide configuration can be provided, for example, in the sidewalls of the slot compartment.

The specification incorporates by reference the entire disclosure of German priority document 10 2017 010 107.8 having a filing date of Oct. 26, 2017.

While specific embodiments of the invention have been shown and described in detail to illustrate the inventive principles, it will be understood that the invention may be embodied otherwise without departing from such principles.

What is claimed is:

1. A device for use in an explosive atmosphere zone, the device comprising:
    a device housing;
    at least one energy supply part comprising at least one battery or at least one rechargeable battery;
    energy-associated supply contacts interacting with device-associated supply contacts when the at least one energy supply part is connected to the device;
    first switches connected upstream of the energy-associated supply contacts;
    second switches connected upstream of the device-associated supply contacts;
    a circuit connected to the first and second switches and controlling the first and second switches such that the first switches deenergize the energy-associated supply contacts and the second switches deenergize the device-associated supply contacts prior to a separation of the at least one energy supply part from the device;
    first trigger circuits connected to the first switches to individually control the first switches;
    second trigger circuits connected to the second switches to individually control the second switches;
    wherein the first and seconds trigger circuits operate independently from each other;
    wherein first control signals for the first trigger circuits are generated in the device and wherein the first switches are activated by the first control signals via the first trigger circuits;
    wherein second control signals for the second trigger circuits are generated in the energy supply part and wherein the second switches are activated by the second control signals via the second trigger circuits.

2. The device according to claim 1, wherein, when connecting the at least one energy supply part to the device, the circuit controls the first and second switches such that the energy-associated supply contacts and the device-associated supply contacts are energized when plugged into each other.

3. The device according to claim 1, wherein the first and second switches are transistors.

4. The device according to claim 1, wherein the device comprises two or more of said second switches that are controlled independent from each other and wherein the at least one energy supply part comprises two or more of said first switches that are controlled independent from each other.

5. The device according to claim 1, further comprising first trigger circuits connected to the first switches and second trigger circuits connected to the second switches, wherein the circuit generates control signals supplied to the first and second trigger circuits, respectively, to individually control the first and second switches.

6. The device according to claim 1, wherein the circuit comprises device-associated switching elements and energy-associated switching elements, wherein the device-associated switching elements actuate the first switches and the energy-associated switching elements actuate the second switches.

7. The device according to claim 6, wherein the device-associated switching elements are areal contacts and the energy-associated switching elements are contact elements interacting with the areal contacts.

8. A device for use in an explosive atmosphere zone, the device comprising:
    a device housing;
    at least one energy supply part comprising at least one battery or at least one rechargeable battery;
    energy-associated supply contacts interacting with device-associated supply contacts when the at least one energy supply part is connected to the device;
    first switches connected upstream of the energy-associated supply contacts;
    second switches connected upstream of the device-associated supply contacts;
    a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises device-associated switching elements and energy-associated switching elements, wherein the device-associated switching elements actuate the first switches and the energy-associated switching elements actuate the second switches;

wherein the device-associated switching elements are areal contacts and the energy-associated switching elements are contact elements interacting with the areal contacts;

wherein the contact elements are spring contact pins.

9. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises device-associated switching elements and energy-associated switching elements, wherein the device-associated switching elements actuate the first switches and the energy-associated switching elements actuate the second switches;

wherein the device-associated switching elements are areal contacts and the energy-associated switching elements are contact elements interacting with the areal contacts;

wherein the areal contacts are provided on a short-circuit strip and the contact elements are provided on a contact strip.

10. The device according to claim 6, wherein the device-associated switching elements are contact elements and the energy-associated switching elements are areal contacts interacting with the contact elements.

11. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises device-associated switching elements and energy-associated switching elements, wherein the device-associated switching elements actuate the first switches and the energy-associated switching elements actuate the second switches;

wherein the device-associated switching elements are contact elements and the energy-associated switching elements are areal contacts interacting with the contact elements;

wherein the contact elements are spring contact pins.

12. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises device-associated switching elements and energy-associated switching elements, wherein the device-associated switching elements actuate the first switches and the energy-associated switching elements actuate the second switches;

wherein the device-associated switching elements are contact elements and the energy-associated switching elements are areal contacts interacting with the contact elements;

wherein the areal contacts are provided on a short-circuit strip and the contact elements are provided on a contact strip.

13. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises first and second switching elements interacting with each other, wherein the first switching elements are permanent magnets and the second switching elements are magnet sensors.

14. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the circuit comprises first and second switching elements interacting with each other, wherein the first switching elements are proximity sensors and the second switching elements are inductive or capacitive elements.

15. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein the device housing is provided with at least one multi-stage slide guide engaged by at least one sliding block arranged at the at least one energy supply part.

16. The device according to claim 15, wherein the at least one multi-stage slide guide is embodied such that, when removing the at least one energy supply part from the device, the energy-associated supply contacts and the device-associated supply contacts are first deenergized by the circuit in a first stage of the at least one multi-stage slide guide.

17. The device according to claim 16, wherein the energy-associated supply contacts and the device-associated supply contacts are separated from each other in a second stage of the at least one multi-stage slide guide.

18. A device for use in an explosive atmosphere zone, the device comprising:

a device housing;

at least one energy supply part comprising at least one battery or at least one rechargeable battery;

energy-associated supply contacts interacting with device-associated supply contacts when the at least one energy supply part is connected to the device;

first switches connected upstream of the energy-associated supply contacts;

second switches connected upstream of the device-associated supply contacts;

a circuit connected to the first and second switches and controlling the first and second switches such that the first switches deenergize the energy-associated supply contacts and the second switches deenergize the device-associated supply contacts prior to a separation of the at least one energy supply part from the device;

wherein a housing of the at least one energy supply part is provided with at least one multi-stage slide guide engaged by at least one sliding block arranged at the device housing.

19. The device according to claim 18, wherein the at least one multi-stage slide guide is embodied such that, when removing the at least one energy supply part from the device, the energy-associated supply contacts and the device-associated supply contacts are first deenergized by the circuit in a first stage of the at least one multi-stage slide guide.

20. The device according to claim 19, wherein the energy-associated supply contacts and the device-associated supply contacts are separated from each other in a second stage of the at least one multi-stage slide guide.

* * * * *